(12) United States Patent
Itoh et al.

(10) Patent No.: US 6,650,677 B1
(45) Date of Patent: Nov. 18, 2003

(54) UP-CONVERSION LASER (75) Inventors: Ken Itoh, Yamato (JP); Hideaki Okano, Yokohama (JP); Kiyoyuki Kawai, Yokohama (JP); Ritsuo Yoshida, Zushi (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/547,109

(22) Filed: Apr. 11, 2000

(51) Int. Cl.⁷ ............................................... H01S 3/091
(52) U.S. Cl. ............................. 372/70; 372/68; 372/6; 372/22
(58) Field of Search ........................... 372/5, 6, 20, 21, 372/75, 68, 70, 97, 39, 22

(56) References Cited

U.S. PATENT DOCUMENTS

| | | | | |
|---|---|---|---|---|
| 5,067,134 A | * | 11/1991 | Oomen | 372/6 |
| 5,436,919 A | * | 7/1995 | Chwalek | 372/7 |
| 5,486,947 A | * | 1/1996 | Ohishi | 359/341 |
| 5,621,749 A | * | 4/1997 | Baney | 372/69 |
| 5,659,558 A | | 8/1997 | Tohmon et al. | 372/5 |
| 5,727,007 A | * | 3/1998 | Smart | 372/26 |
| 5,805,631 A | * | 9/1998 | Xie et al. | 372/68 |

FOREIGN PATENT DOCUMENTS

| | | |
|---|---|---|
| EP | 534 750 | 3/1993 |
| JP | 1-274487 | 11/1989 |
| JP | 5-021874 | 1/1993 |
| JP | 6-507045 | 8/1994 |
| JP | 7-142806 | 6/1995 |
| JP | 8-102565 | 4/1996 |
| JP | 8-18129 | 9/1996 |
| JP | 8-307000 | 11/1996 |
| JP | 9-107143 | 4/1997 |
| JP | 10-065237 | 3/1998 |
| JP | 2000-339735 | 12/2000 |
| WO | 92/20125 | 11/1992 |

OTHER PUBLICATIONS

Piehler et al, Laser–Diode–Pumped Red and Green Upconversion Fibre Laser, Electronic Letters, Oct. 14, 1993, vol. 29, No. 21, pp. 1857–1858.
Allain, et al, "Blue Upconversion Fluorozirconate Fibre Laser", Electronic Letters, Feb. 1, 1990, vol. 26, No. 3, pp. 166–168.
Sandrock et al., "High–Power Continuous–Wave Upconversion Fiber Laser at Room Temperature," OPTICS LETTERS, Jun. 1, 1997, vol. 22, No. 11, pp. 808–810.
Kishimoto et al., "Direct Observation of Time–Resolved Excited State Absorption on $Tm^{3+}$–doped Various Glasses Using a Laser–Flash Pump–Probe Spectroscopy," Journal of Non–Crytsalline Solids 213 &214, 1997, pp. 393–397.

* cited by examiner

Primary Examiner—Leon Scott, Jr.
(74) Attorney, Agent, or Firm—Pillsbury Winthrop LLP (57) ABSTRACT An up-conversion laser unit in which a semiconductor laser of high output power can be used as a pump light source and the wavelength of up-converted laser light is suitable for display. The light of infrared wavelength is generated by the pump light source, the generated light being inputted into a $Pr^{3+}$ up-conversion laser to up-convert there into red light by $Pr^{3+}$ ion. The up-converted red light is inputted into, as a pump light source, a $Tm^{3+}$ up-conversion laser, there being up-converted into blue light by the $Tm^{3+}$ ion. Thereby, efficient up-conversion into blue light is made possible.

12 Claims, 10 Drawing Sheets

UP-CONVERSION LASER

BACKGROUND OF THE INVENTION

1. Field of the Invention

The present invention relates to an upconversion laser that, with an infrared semiconductor laser of high output or an external resonance laser as a pump light source, by making use of upconversion phenomena of a rare earth doped optical fiber, outputs visible light for display use.

2. Description of the Related Art

First, an explanation of conventional upconversion due to a rare earth doped optical fiber will be given in the following.

As to upconversion to blue light, there is a report in which infrared light excites tri-valent thulium ions ($Tm^{3+}$) to let oscillate with a wavelength of around 480 nm. According to Japanese Patent Laid-open Publication (KOKAI) No. HEI 8-307000 titled "Rare earth ion doped short wavelength laser apparatus, rare earth ion doped short wavelength light amplifier and rare earth ion doped wavelength converter", an upconversion is proposed in which wavelengths of approximately 1200 nm and approximately 650 nm are up-converted to an wavelength of approximately 480 nm. Though it says that efficient upconversion can be realized due to excitation with two wavelengths, a blue wavelength of 480 nm is a little longer for as the blue light for display use, being inappropriate for display use.

Similarly, Japanese Patent Laid-open Publication (KOKAI) No. HEI 7-142806 titled "Rare earth ion doped short wavelength laser light source" and Japanese Patent Laid-open Publication No. (KOKAI) HEI 9-107143 titled "Blue up-conversion laser" disclose the following invention. That is, by means of an infrared laser of one wavelength (800 to 980 nm, for instance 850 nm), an optical fiber doped by trivalent praseodymium ion ($Pr^{3+}$) and trivalent ytterbium ion ($Yb^{3+}$) can be excited. By use of laser oscillation of $Yb^{3+}$ ion of approximately 1020 nm followed the above excitation, $Pr^{3+}$ ion is excited to obtain blue emission of 490 nm.

Thus, it has been proposed to upconvert infrared light to blue light, however, there has not yet been disclosed to upconvert to the blue of a wavelength of approximately 470 nm appropriate for display.

In Japanese Patent Application No. HEI 11-149751 titled "Up-conversion Fiber Laser", which the present inventors have proposed, an up-conversion fiber laser is disclosed to obtain blue light appropriate for display. This application, with a red emitting superluminescent diode (SLD) as a pump light source, up-converts to two wavelengths of 450 nm and 480 nm, followed by mixing thereof to obtain blue color for display.

Though it might be improved in the future, there is a disadvantage that, at the present time, despite SLD's for infrared wavelength having been already mass-produced to be relatively inexpensive, SLD's for red wavelength are rather expensive from the viewpoint of cost. In addition to this, there is also another demerit that products of high output power are difficult to procure.

As a method that outputs red laser light, there is one that up-convert from infrared wavelength. A $Pr^{3+}$ ion doped fiber is practically used in a $Pr^{3+}$ ion doped optical fiber amplifier (PDFA) in which with infrared wavelength as a pump light source, signal of a band of 1.3 $\mu$m is amplified. Other than this, it is known that due to the upconversion, blue, green and red emissions can be generated.

In "High-power continuous-wave upconversion fiber laser at room temperature", Optics letter/vol.22, No.11/June 1, 1997, by T. Sandrock et al, they say that from a $Pr^{3+}$ and $Yb^{3+}$ ion doped fiber, with exciting light of approximately 850 nm, 635 nm laser light of high output power can be obtained.

Further, similarly, also U.S. Pat. No. 5,805,631 "Blue, Green, Orange, and Red Upconversion Laser" proposes to obtain blue, green, orange and red colors from a $Pr^{3+}$ and $Yb^{3+}$ ion doped fiber.

In employing the $Pr^{3+}$ and $Yb^{3+}$ ion doped fiber, pump light of one wavelength is said to be capable of exciting. However, from the viewpoint of efficiency, a wavelength appropriate for ground state absorption (GSA) of $Yb^{3+}$ and a wavelength appropriate for excited state absorption (ESA) are not the same. Accordingly, excitation with one wavelength constitutes a state of poor efficiency. When assumed realization of high power laser, this point causes problems.

Now, there are two bands of 630 nm and 680 nm in a red emission line spectrum of $Pr^{3+}$ ion. According to "Direct observation of time-resolved excited state absorption on $Tm^{3+}$-doped various glasses using a laser-flash pump-probe spectroscopy", J. Non-Cryst. Solids, 1997 by S. Kishimoto et al, these wavelengths are known to be ones appropriate for ground state absorption (GSA) and excited state absorption (ESA) of $Tm^{3+}$ ion.

However, so far, in the case of employing $Pr^{3+}$ ion, the up-converted laser light is the final output and is not employed again as exciting light. Accordingly, precious properties of $Pr^{3+}$ ion of having wavelengths appropriate for excitation of $Tm^{3+}$ ion is not made the best use of.

An object of the present invention is to provide an upconversion laser in which a semiconductor laser of high output power can be used as a pump light source and wavelengths of the up-converted laser light are ones appropriate for display.

Another object of the present invention is to provide an upconversion laser capable of being excited with more efficient wavelengths.

SUMMARY OF THE INVENTION

To achieve the above ends, the present invention comprises a first upconversion laser performing upconversion excitation of praseodymium ion ($Pr^{3+}$), and a second upconversion laser exciting thulium ion ($Tm^{3+}$) by laser light of wavelengths of approximately 635 nm and approximately 685 nm that are obtained from the first upconversion laser. Here, the output laser light of the second upconversion laser has wavelengths of approximately 450 nm and/or approximately 480 nm.

Thereby, the wavelengths emitted from $Pr^{3+}$ ion being ones just appropriate for excitation of $Tm^{3+}$ ion, conversion from red laser light to blue laser light can be performed with high efficiency. Thereby, as the pump light source, external resonance type LD, SLD and LD that have high output power in infrared wavelengths can be used, resulting in blue laser light optimum for display.

The present invention comprises a first cavity and a second cavity. The first cavity comprises an external resonance type laser and a praseodymium ion ($Pr^{3+}$) doped fiber, wherein with laser light emitted from the external resonance type laser as exciting light, the praseodymium ion is excited by upconversion to emit red light, the red light being resonated to oscillate laser. The second cavity comprises a thulium ion ($Tm^{3+}$) doped optical fiber, wherein with the red light as exciting light, the thulium ion is excited by upconversion to generate blue light, the blue light being resonated to oscillate laser.

Thereby, as the pump light source, external resonance infrared LD of high output power can be selected, resulting in use of the selected device of high output power. Even if high output power is required in displaying a large image screen, blue laser light most appropriate for display can be obtained.

Furthermore, the present invention comprises a cavity, a $Pr^{3+}$ and $Yb^{3+}$ ion doped optical fiber, and a resonator structure. The cavity includes an external resonance laser that emits two kinds of laser lights of wavelengths of 780 nm to 900 nm and 950 nm to 1050 nm. The $Pr^{3+}$ and $Yb^{3+}$ ion doped optical fiber is disposed in the cavity and the laser light is inputted thereon. The resonant structure is disposed in the cavity, and causes the red light emitted through upconversion by the optical fiber to resonate.

Thereby, the up-converted red laser light can be obtained with a high efficiency.

Still further, the present invention comprises a cavity, a $Pr^{3+}$ and $Yb^{3+}$ ion doped optical fiber, and a resonant structure. The cavity includes an external resonance laser that emits two kinds of laser lights of wavelengths at 780 nm to 900 nm and 950 nm to 1050 nm. The $Pr^{3+}$ and $Yb^{3+}$ ions doped optical fiber is disposed in the cavity and the laser light is inputted thereon. The resonant structure is disposed in the cavity, and causes the green light generated through upconversion by the optical fiber to resonate.

Thereby, the up-converted green laser light of high efficiency can be obtained.

DESCRIPTION OF THE PREFERRED EMBODIMENTS

In the present invention, as a preferable example, upconversion excitation of $Pr^{3+}$ ion is performed by means of two kinds of laser lights of wavelengths of approximately 780 to 900 nm and approximately 1010 nm.

As a preferable example, a first upconversion laser performs upconversion excitation of $Pr^{3+}$ and ytterbium ion ($Yb^{3+}$) doped one.

As a preferable example, a praseodymium ion ($Pr^{3+}$) doped optical fiber is doped, in addition to praseodymium ion, by ytterbium ion ($Yb^{3+}$).

As a preferable example, host glass of the praseodymium ion doped optical fiber is any one of indium based fluoride glass, aluminum based fluoride glass and zirconium based fluoride glass.

As a preferable example, an external resonant laser emits laser light of a wavelength of approximately 850 nm to excite $Pr^{3+}$ and $Yb^{3+}$ ions.

As a preferable example, two kinds of laser lights of wavelengths of from 780 to 900 nm and from 950 to 1050 nm are used to excite $Pr^{3+}$ ion.

As a preferable example, as a structure for resonating of red light or blue light, a fiber grating or a dielectric mirror is used.

In the following, present embodiments will be explained in detail with reference to drawings.

Figure 1:
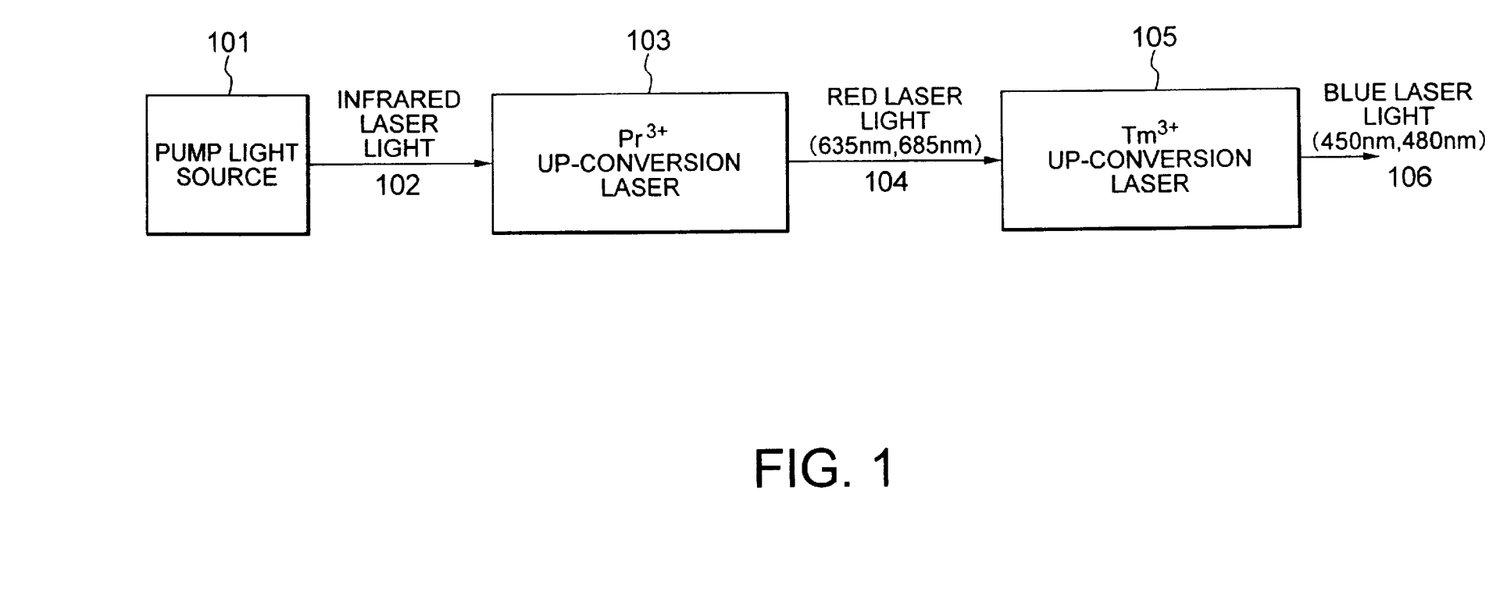
FIG. 1 is a constitutional diagram for explaining a first embodiment of the present invention.

FIG. 1 is a constitutional diagram for explaining a first embodiment of the present invention. In FIG. 1, a pump light source 101 is one that emits infrared wavelengths, the wavelengths thereof being two kinds in a range of from 780 to 900 nm and approximately 1010 nm. Laser light 102 emitted from the pump light source 101 is incident on a $Pr^{3+}$ upconversion laser 103. The $Pr^{3+}$ upconversion laser 103 receives the laser light 102 from the pump light source 101 to upconvert the infrared wavelength light into red light of approximately 635 nm and approximately 685 nm, outputting laser light.

Red laser light 104 from the $Pr^{3+}$ upconversion laser 103 is incident on a $Tm^{3+}$ upconversion laser 105. The $Tm^{3+}$ upconversion laser 105 receives the red laser light 104 to upconvert the red wavelength light into blue light of approximately 450 nm and approximately 480 nm, outputting blue laser light 106.

Figure 2:
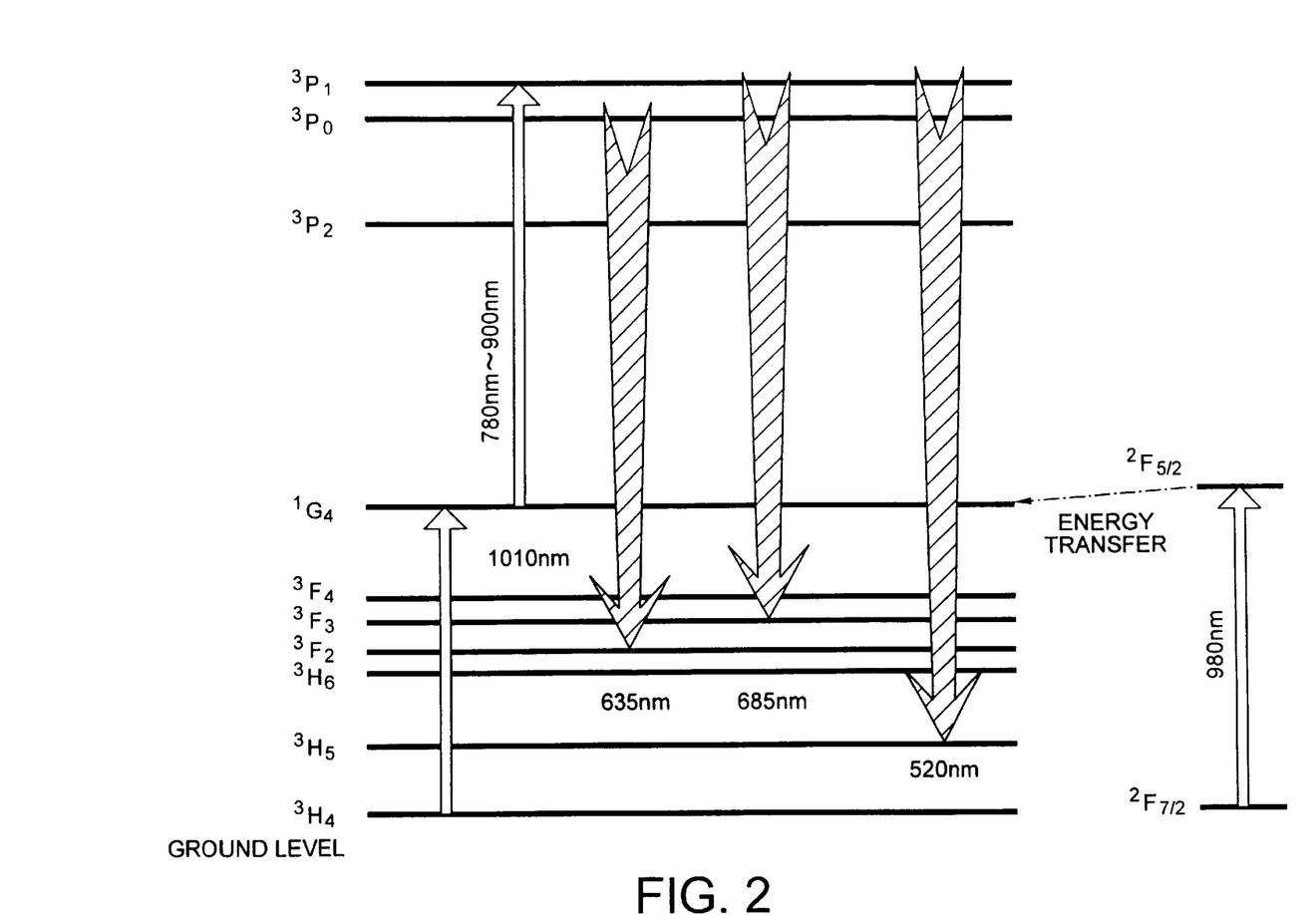
FIG. 2 is a diagram for explaining energy levels of $Pr^{3+}$ ion.

FIG. 2 is diagram for explaining energy levels of a $Pr^{3+}$ ion. In order to excite from a ground level of the $Pr^{3+}$ ion, $^3H_4$, to an excited level thereof, $^1G_4$ the $Pr^{3+}$ ion absorbs infrared light of a wavelength of approximately 1010 nm. Further upon absorbing infrared light of a wavelength of from 790 nm to 1010 nm, the $Pr^{3+}$ ion is excited from the $^1G_4$ level to further excited levels of $^3P_0$ and $^3P_1$. During transitions of $^3P^0 \rightarrow {}^3F_2$ and $^3P_1 \rightarrow {}^3F_3$, lights of wavelengths of approximately 635 nm and approximately 685 nm are emitted, respectively. For the two wavelengths, resonators are formed to cause stimulated emission of radiation to emit the laser lights of wavelengths of approximately 635 nm and approximately 685 nm.

Figure 3:
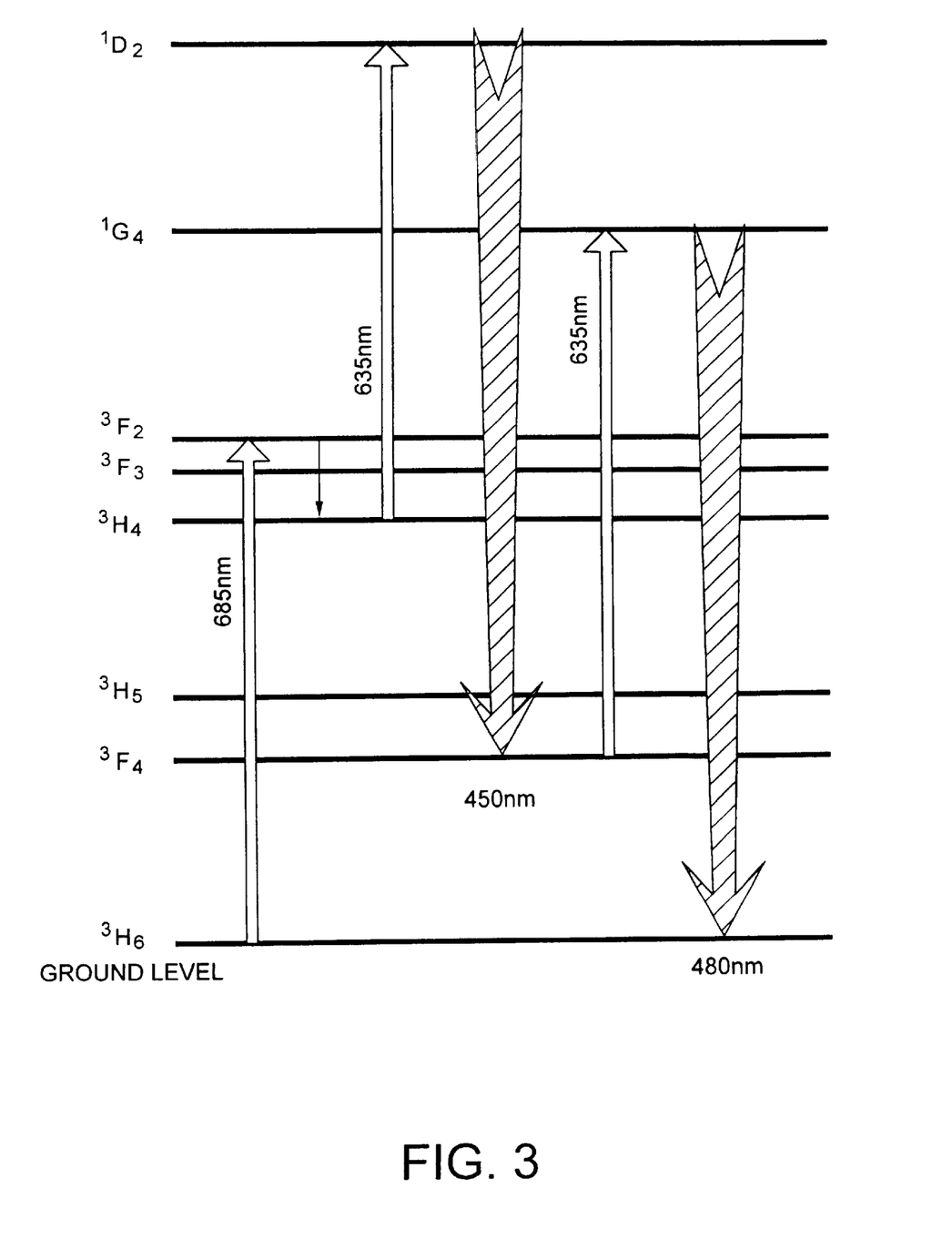
FIG. 3 is a diagram for explaining energy levels of $Tm^{3+}$ ion.

Similarly, with reference to FIG. 3, energy levels of $Tm^{3+}$ ion will be explained. Upon absorbing red light of a wavelength of approximately 685 nm, the $Tm^{3+}$ ion is excited from a ground level thereof, $^3H_6$, to an excited level thereof, $^3F_2$. The $^3F_2$ level, though instantaneously dropping to $^3H_4$ level, from the $^3H_4$, upon further absorbing red light of a wavelength of 635 nm, is further excited to an excited level, $^1D_2$. Upon transition of $^1D_2 \rightarrow {}^3F_4$, light of a wavelength of approximately 450 nm is emitted. The $^3F_4$ level further absorbs red light of a wavelength of 635 nm to be excited to $^1G_4$ level. Upon transition of $^1G_4 \rightarrow {}^3H_6$, light of a wavelength of approximately 480 nm is emitted. Of the two wavelengths, resonators are formed to cause stimulated emission of laser light of wavelengths of approximately 450 nm and approximately 480 nm.

As explained above, the wavelengths of light emitted from $Pr^{3+}$ ion is ones just appropriate for excitation of $Tm^{3+}$ ion. That is, for $Tm^{3+}$ ion, there are wavelengths appropriate for GSA and ESA in the excitation process leading to an emission of 450 nm and 480 nm in the vicinities of 685 nm and 635 nm, respectively. Accordingly, conversion from red laser light to blue laser light can be performed with high efficiency. Thereby, external resonance type LD, SLD and LD of high output power in infrared wavelength can be used as an pump light source, blue laser light most appropriate for display being obtained.

Next, the present second embodiment will be explained with reference to FIG. 4. In the present embodiment, instead of the $Pr^{3+}$ upconversion laser 103 in FIG. 1, a $Pr^{3+}+Yb^{3+}$ upconversion laser 108 is used. Constituent elements the same with. FIG. 1 are given the same reference numerals to explain.

An $Yb^{3+}$ ion is characteristic in absorbing a broad wavelength band centering at 980 nm to be excited to an energy level in the neighborhood of an excited level of a $Pr^{3+}$ ion due to light of 1010 nm. Thereby, the energy thereof can be given to other ion of close energy level thereto by the process of energy transfer.

As shown in FIG. 2, a $Yb^{3+}$ ion absorbs the light centering 980 nm to cause $^2F_{7/2} \rightarrow ^2F_{5/2}$ transition followed by energy transfer from $^2F_{5/2}$ level to $^1G_4$ level of $Pr^{3+}$. Thereby, the exciting wavelength of a $Pr^{3+}+Yb^{3+}$ upconversion laser can be in the ranges of wavelengths of from 780 nm to 900 nm and from 950 nm to 1050 nm as the laser light 107 from the pump light source 101. Thus, the range can be broadened than for the case of $Pr^{3+}$ alone.

In addition, since the $Yb^{3+}$ ion can be excited, though not so efficient, by the light of approximately 850 nm, the wavelength of the laser light 107 from the pump light source 101 can be one wavelength of approximately 850 nm. As for the exciting process and laser light generation action of $Pr^{3+}$ and $Tm^{3+}$ ions after excitation thereof, the explanation is identical with that of embodiment 1.

Thus, by employing an up-conversion laser in which $Yb^{3+}$ ion is doped together with $Tm^{3+}$ ion, as the pump light source, external resonant type LD, SLD and LD that emit in a broader wavelength region of infrared can be selected, resulting in use of a selected device of high output power. Thereby, even when higher output power is demanded for displaying a larger size screen, a blue laser light optimum for display can be obtained.

Furthermore, excitation with one wavelength of approximately 850 nm being possible, though less efficient, the configuration can be simplified. In this case, the present laser can be used as a small and simple light source for display.

In the above explanation, the pump light source and the up-conversion laser are separately handled as independent ones, parts of the cavities of separate resonators can be constituted to overlap with one another.

Figure 5:
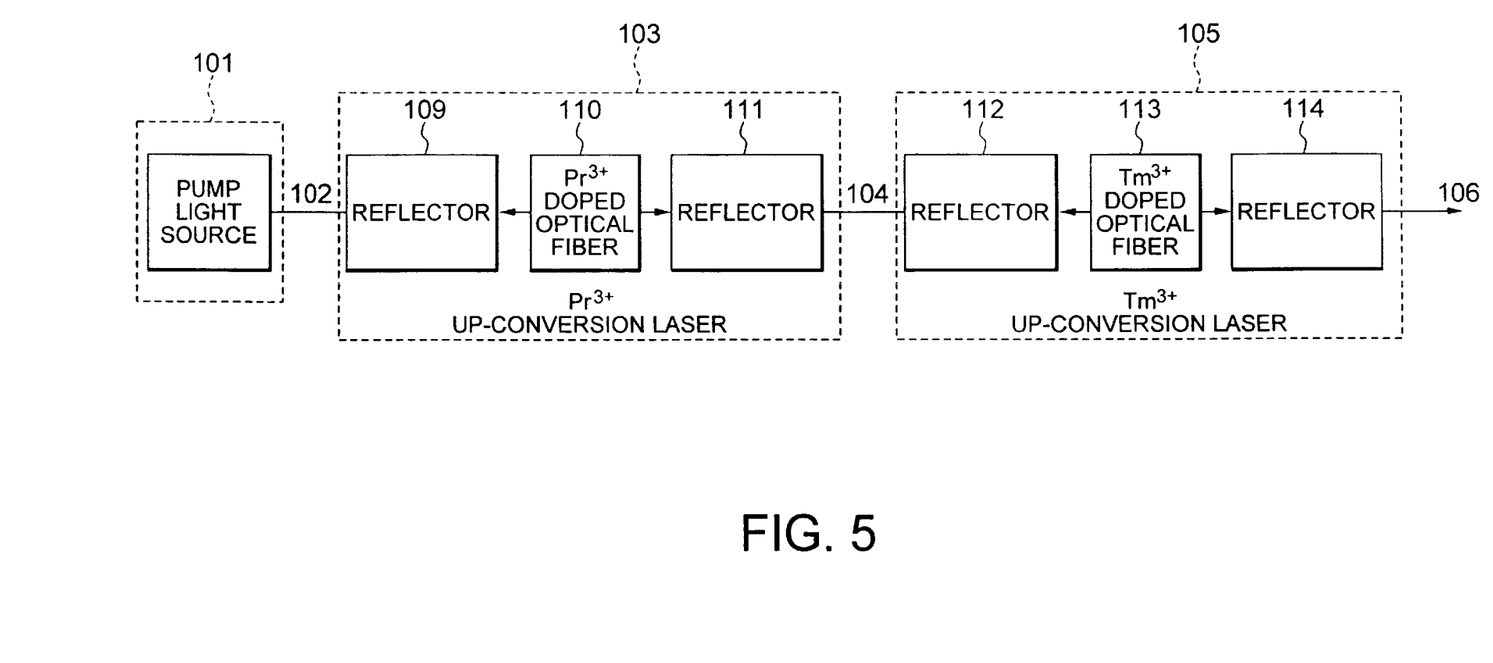
FIG. 5 is a constitutional diagram for explaining a third embodiment of the present invention.

FIG. 5 is a diagram for explaining a third embodiment of the present invention. Specific examples of the $Pr^{3+}$ up-conversion laser 103 and the $Tm^{3+}$ up-conversion laser 105 of FIG. 1 will be explained.

The laser light 102 emitted from the pump light source 101 is inputted into the $Pr^{3+}$ up-conversion laser 103. The $Pr^{3+}$ up-conversion laser 103 comprises a first reflector 109, a $Pr^{3+}$ doped optical fiber 110 and a second reflector 111, the incident laser light 102 passing through the first reflector 109 to be incident on the $Pr^{3+}$ doped optical fiber 110. In the $Pr^{3+}$ doped optical fiber 110, the laser light 102 from the pump light source 101 is up-converted to emit light of 635 nm and 685 nm. The first reflector 109 allows for the laser light 102 from the pump light source 101 to go through but reflects approximately 100 percent of the light in the neighborhood of 635 nm and 685 nm.

The second reflector 111 reflects the light of infrared wavelength and in the neighborhood of 635 nm and 685 nm to enable to constitute a resonator together with the reflector 109. Thereby, the light in the neighborhood of 635 nm and 685 nm can be amplified due to stimulated emission of radiation to result in laser oscillation. Reflectivity of the second reflector 111 in the neighborhood of 635 nm and 685 nm is made lower than that of the first reflector 109, resulting in emission of laser light 104. The laser light 104 passed through the second reflector 111 is incident on the $Tm^{3+}$ up-conversion laser 105.

The $Tm^{3+}$ up-conversion laser 105 comprises a third reflector 112, a $Tm^{3+}$ doped optical fiber 113 and a fourth reflector 114, the incident laser light 104 going through the third reflector 112 to enter into the $Tm^{3+}$ doped optical fiber 113. At the $Tm^{3+}$ doped optical fiber 113, the laser light 104 that is red light is up-converted to emit light of wavelengths of 450 nm and 480 nm. The third reflector 112, though permitting the red laser light 104 to pass through, reflects approximately 100 percent of the light in the neighborhood of 450 nm and 480 nm.

The fourth reflector 114 reflects the laser light 104 and light of wavelengths of 450 nm and 480 nm. Accordingly, a resonator can be constituted of the two reflectors 112 and 114, thereby light of 450 nm and 480 nm being amplified due to stimulated emission of radiation to result in laser oscillation. Reflectivity of the fourth reflector 114 in the neighborhood of 450 nm and 480 nm is made lower than that of the third reflector 112 to permit emitting blue laser light 106 alone.

The respective constituent reflectors of the resonator is necessary to be constituted for the wavelength being oscillated to be reflected sufficiently and for the wavelength that is desired not to oscillate to be reflected less not to constitute a resonator.

Figure 4:
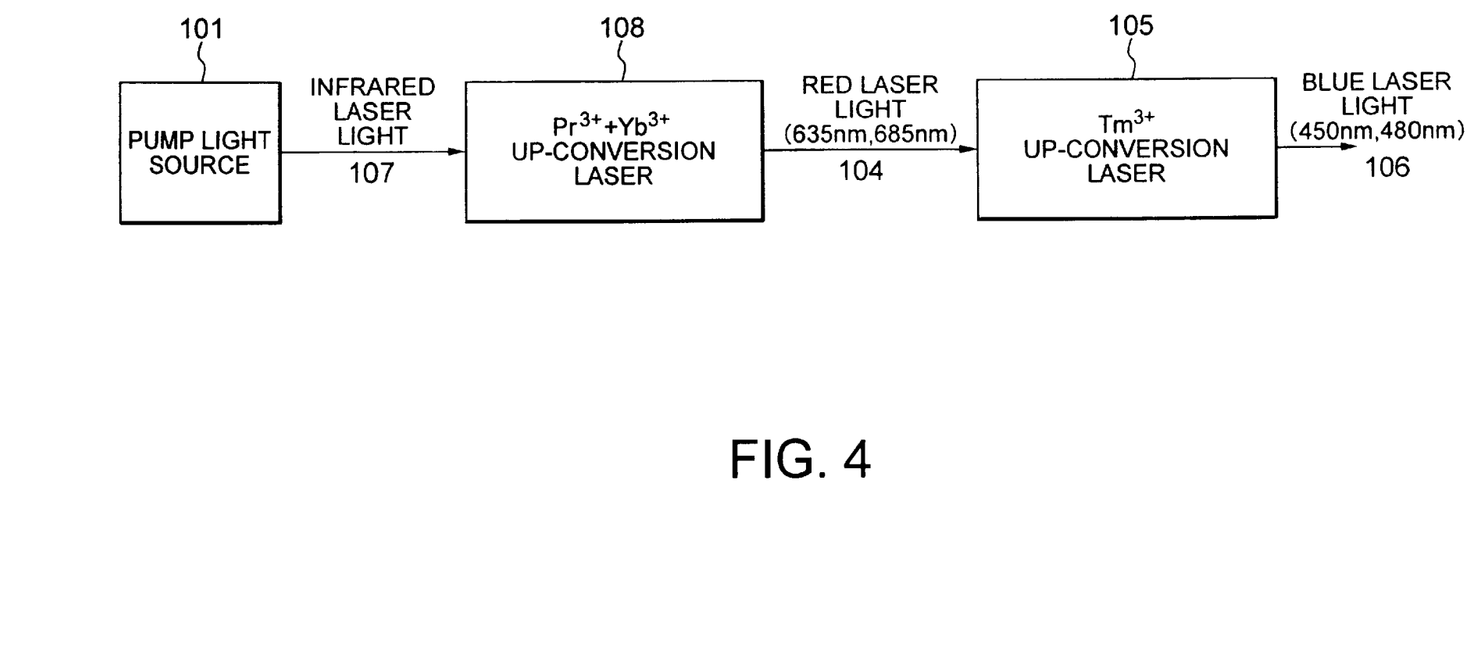
FIG. 4 is a constitutional diagram for explaining a second embodiment of the present invention.

When in the place of the $Pr^{3+}$ doped optical fiber 110 a $Pr^{3+}+Yb^{3+}$ doped optical fiber is employed, a specific configuration of an embodiment of FIG. 4 can be obtained. In this case, because of change of the wavelength of the laser light 102 from the pump light source 101, characteristics of the first and second reflectors 109 and 111 must be changed to the wavelength matching the laser lights to cope with.

Here, as glass base materials for a $Pr^{3+}$, $Tm^{3+}$ and $Yb^{3+}$ doped optical fiber, so that the transition from the excited upper energy levels to lower energy levels do not result in meaningless transitions, glasses of which phonon energy is small are adequate. That is, fluoride based glasses such as indium based fluoride glass, aluminum based fluoride glass and zirconium based fluoride glass, of which phonon energy is said to be small, can be used as base materials for the doped optical fibers to realize a fiber laser of high emission efficiency.

Next, with reference to FIG. 6, a fourth embodiment of the present invention will be explained. Constituent elements that are the same with FIG. 5 are given the same reference numerals to explain.

That is, a pump light source 101 comprises an external resonance LD 115 and a second reflector 111. An end-surface 116 of the external resonance LD 115 and the second reflector 111 constitute a resonator to let emit the light of a wavelength of laser light 102 due to stimulated emission of radiation. Inside of a cavity of the resonator, a $Pr^{3+}$ up-conversion laser 103 is disposed.

The $Pr^{3+}$ up-conversion laser 103 comprises a first reflector 109, a $Pr^{3+}$ doped optical fiber 110 and a second reflector 111. The incident laser light 102 goes through the first reflector 109 and is incident on the Pr$^{3+}$ doped optical fiber 110. The Pr$^{3+}$ doped optical fiber 110 up-converts the laser light 102 from the pump light source 101 to emit the light in the neighborhood of 635 nm and 685 nm. The first reflector 109 allows the laser light 102 to go through but reflects approximately 100 percent of the light in the neighborhood of 635 nm and 685 nm.

The second reflector 111 reflects the light of the wavelength of the laser light 102 and the light in the neighborhood of 635 nm and 685 nm. Thus, two reflectors 109 and 111 constitute a resonator, thereby the light in the neighborhood of 635 nm and 685 nm being amplified due to the stimulated emission of radiation to result in laser oscillation. Here, reflectivity of the second reflector 111 in the neighborhood of 635 nm and 685 nm is made less than that of the first reflector 109 to let emit the laser light 104. The laser light 104 gone through the second reflector 111 is incident on a Tm$^{3+}$ up-conversion laser 105.

For the external resonance LD 115, the Pr$^{3+}$ up-conversion laser 103 in the cavity being regarded as a loss, to make up for the loss to enable amplifying, a plurality of the external resonance LDs 115 can be arranged to constitute.

Further, a Tm$^{3+}$ up-conversion laser 105, upon incidence of the laser light 104, outputs the laser light 106 of the wavelengths of 450 nm and 480 nm.

Instead of the Pr$^{3+}$ doped optical fiber 110, a Pr$^{3+}$+Yb$^{3+}$ doped optical fiber can be disposed. In this case, the wavelength of the laser light 102 being different, characteristics of the first and second reflectors 109 and 111 must be changed to wavelength matching the laser light 102 to cope with.

Thus, disposition of the Pr$^{3+}$ up-conversion laser in the cavity of the pump light source can give the identical effect to result in blue laser light optimum for display. Similarly, the Tm$^{3+}$ up-conversion laser can be disposed inside of the cavity of the Pr$^{3+}$ up-conversion laser.

Next, with reference to a configuration diagram of FIG. 7, a fifth embodiment of the present invention will be explained. That is, the laser light 102 emitted from the pump light source 101 is incident on a Pr$^{3+}$ up-conversion laser 103. The Pr$^{3+}$ up-conversion laser 103 comprises a first reflector 109, a Pr$^{3+}$ doped optical fiber 110, a Tm$^{3+}$ doped up-conversion laser 105 and a second reflector 111, the incident laser light 102 passing through the first reflector 109 and entering in the Pr$^{3+}$ doped optical fiber 110. The Pr$^{3+}$ doped optical fiber 110 up-converts the laser light 102 from the pump light source 101 to emit the light of 635 nm and 685 nm. The first reflector 109 permits the laser light 102 from the pump light source 101 to go through but reflects approximately 100 percent of the light in the neighborhood of 635 nm and 685 nm.

The second reflector 111 reflects approximately 100 percent of the light in the neighborhood of 635 nm and 685 nm. Thus, two reflectors 109 and 111 constitute a resonator, thereby the light in the neighborhood of 635 nm and 685 nm being amplified due to the stimulated emission of radiation to result in laser oscillation. Here, the second reflector 111 let the laser light 106 generated at the Tm$^{3+}$ doped up-conversion laser 105 go through.

The laser light 104 enters into the Tm$^{3+}$ up-conversion laser 105. The Tm$^{3+}$ doped up-conversion laser 105 comprises a third reflector 112, a Tm$^{3+}$ doped optical fiber 113 and a fourth reflector 114, the incident laser light 104 passing through the third reflector 112, entering into the Tm$^{3+}$ doped optical fiber 113. The Tm$^{3+}$ doped optical fiber 113 up-converts the laser light 104 that is red to emit the light of wavelengths of 450 nm and 480 nm.

The third reflector 112 permits the red laser light 104 to go through but reflects approximately 100 percent of the light in the neighborhood of 450 nm and 480 nm and the light of the laser light from the pump light source 102.

The fourth reflector 114 reflects the light in the neighborhood of 450 nm and 480 nm. Thus, two reflectors 112 and 114 constitute a resonator, thereby the light in the neighborhood of 450 nm and 480 nm being amplified due to the stimulated emission of radiation to result in laser oscillation. Here, the reflectivity of the fourth reflector 114 in the neighborhood of 450 nm and 480 nm is made smaller than that of the third reflector 112 to let emit the blue laser light 106 alone.

In the above, the second and fourth reflectors 111 and 114 are separately explained. However, these can be combined into one body, reflectivity of which in the neighborhood of 450 nm and 480 nm is made smaller than that of the third reflector 112, and reflectivity of the red laser light 104 of which is approximately 100 percent.

Figure 8:
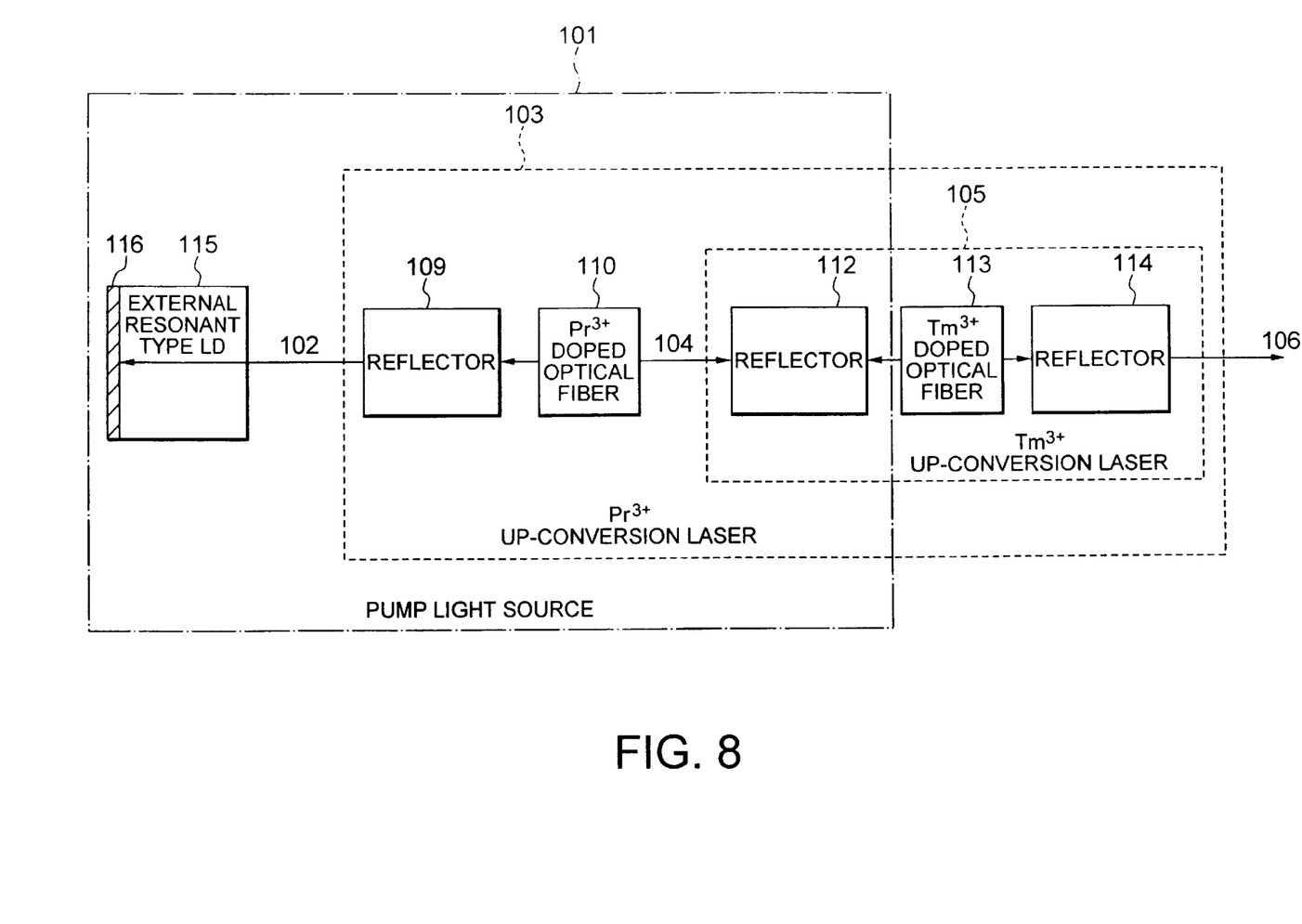
FIG. 8 is a constitutional diagram for explaining a sixth embodiment of the present invention.

FIG. 8 is a constitution diagram for explaining a sixth embodiment of the present invention. In the present embodiment, in a cavity of the pump light source 101 a Pr$^{3+}$ doped optical fiber 110 of a Pr$^{3+}$ up-conversion laser 103 is placed, further in a cavity of the Pr$^{3+}$ up-conversion laser 103 a Tm$^{3+}$ up-conversion laser 105 is placed.

In this case, a third reflector 112 lets the laser light 104 go through and reflect approximately 100 percent of the light in the neighborhood of 450 nm and 480 nm. A fourth reflector 114 reflects approximately 100 percent of the laser light 104 and lets part of the light in the neighborhood of 450 nm and 480 nm go through to output the laser light 106. Thereby, a resonator of the pump light source 101 is constituted of an end-surface 116 and the third reflector 112, and a resonator of the Pr$^{3+}$ up-conversion laser 103 is constituted of the first reflector 109 and the fourth reflector 114.

Fluoride based glasses such as indium based fluoride glass, aluminum based fluoride glass and zirconium based fluoride glass, which are said to have small phonon energy thereof, are naturally adequate for the base materials for the doped optical fibers 110 and 113.

The reflectors can be realized by means of a dielectric mirror in which the reflectivity thereof is tailored to the respective wavelengths or by means of fiber grating. In the case of the fiber grating being used, simultaneous tailoring of the reflectivity to a plurality of wavelengths being difficult, a plurality of fiber gratings for each wavelengths are arranged. That is, the respective reflectivity of each wavelength that is designated to each reflector in the above explanation is realized in one body of a plurality of fiber gratings, the fiber gratings being only arranged to cope with.

Even in the configurations explained in the above, as the pump light sources of infrared wavelength such as the external resonance LD, SLD and LD of high output power can be used, resulting in blue laser light optimum for display.

Figure 6:
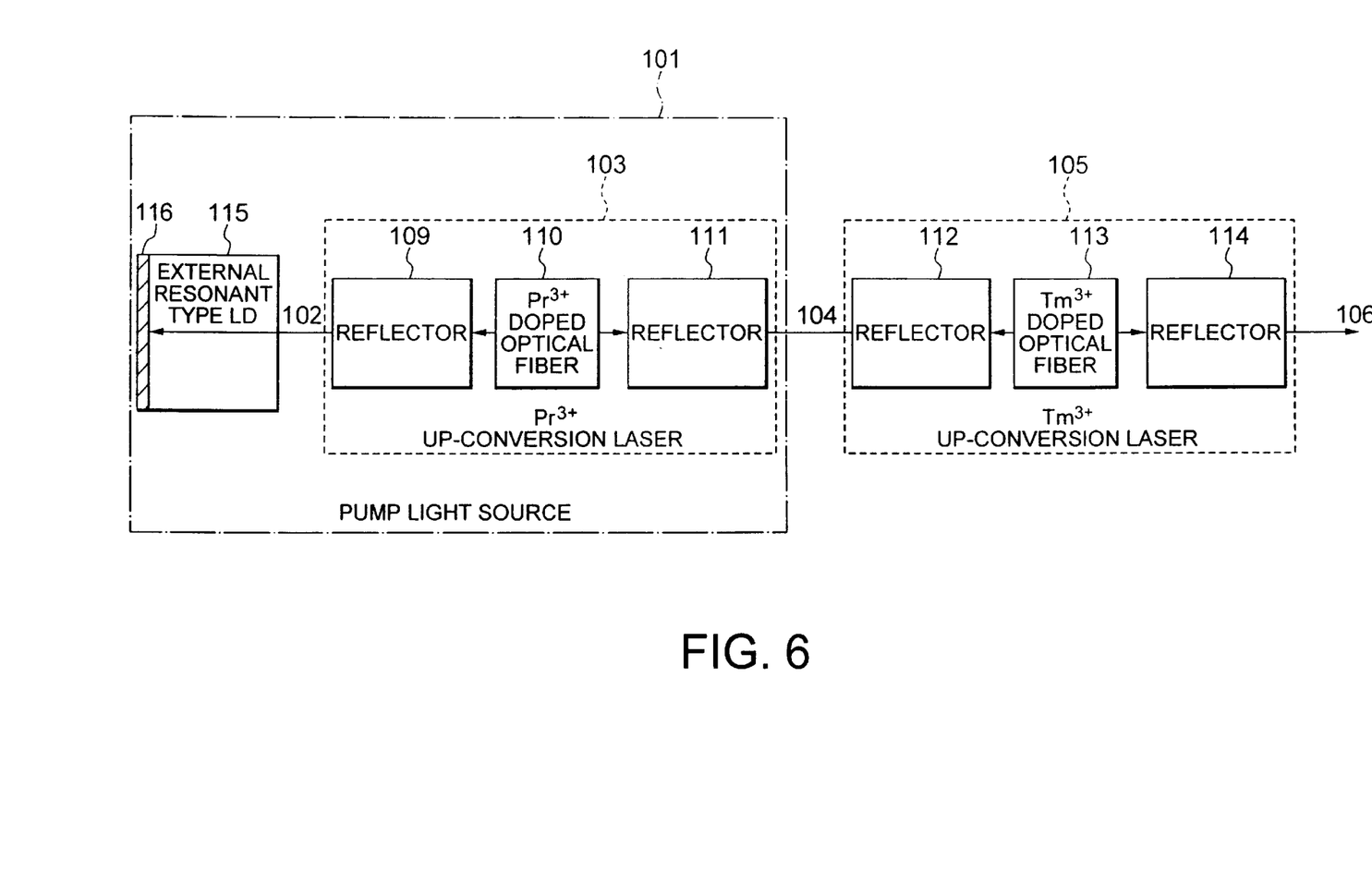
FIG. 6 is a constitutional diagram for explaining a fourth embodiment of the present invention.
Figure 7:
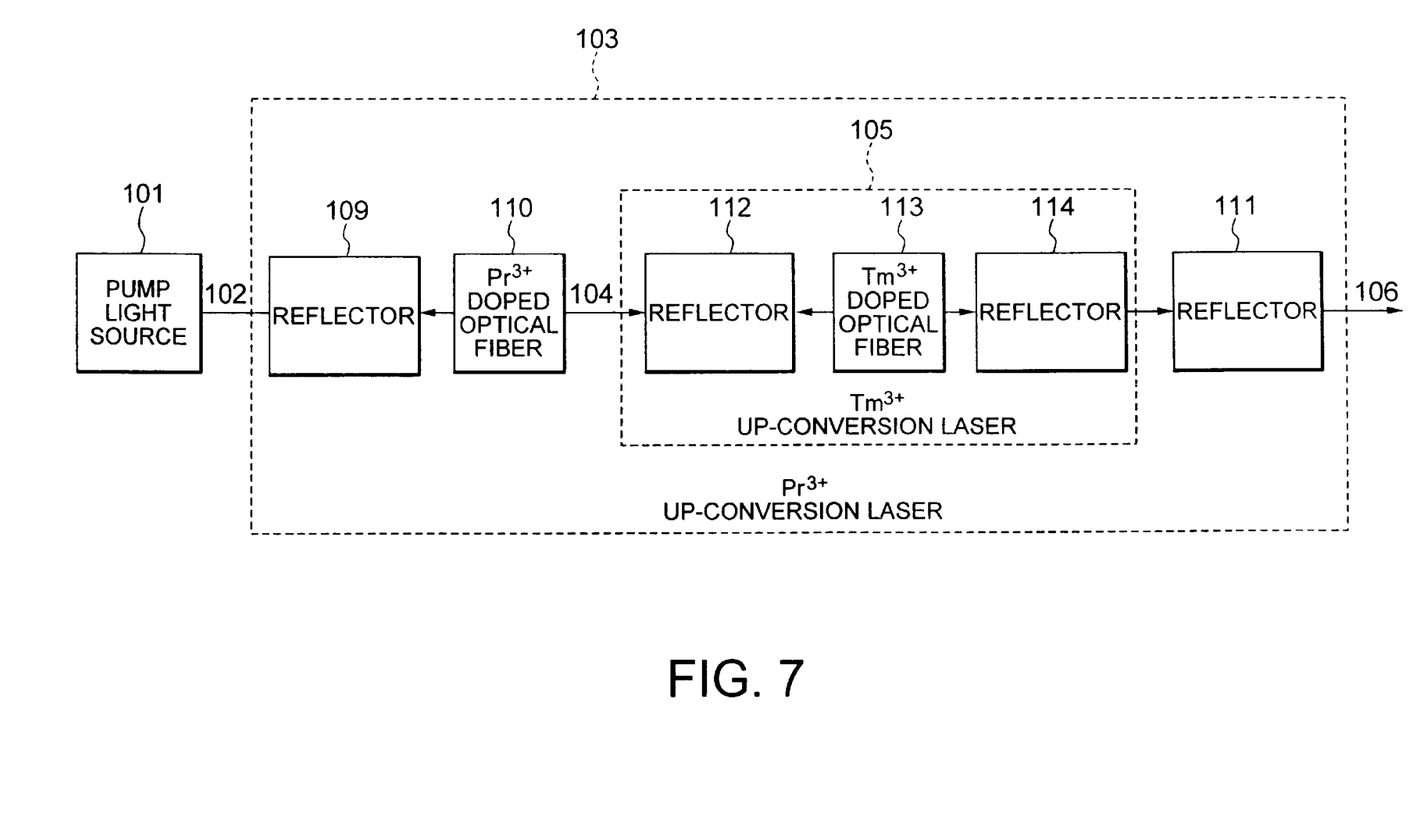
FIG. 7 is a constitutional diagram for explaining a fifth embodiment of the present invention.

In each embodiments of FIGS. 6 to 8, in the place of the respective Pr$^{3+}$ doped optical fibers 110 a Pr$^{3+}$+Yb$^{3+}$ doped optical fiber that is explained in embodiment of FIG. 4 can be used. In this case, the wavelength of the laser light 102 from the pump light source 101 being different, characteristics of each reflectors are tailored to the wavelength matching the laser light 102 to cope with.

Figure 9:
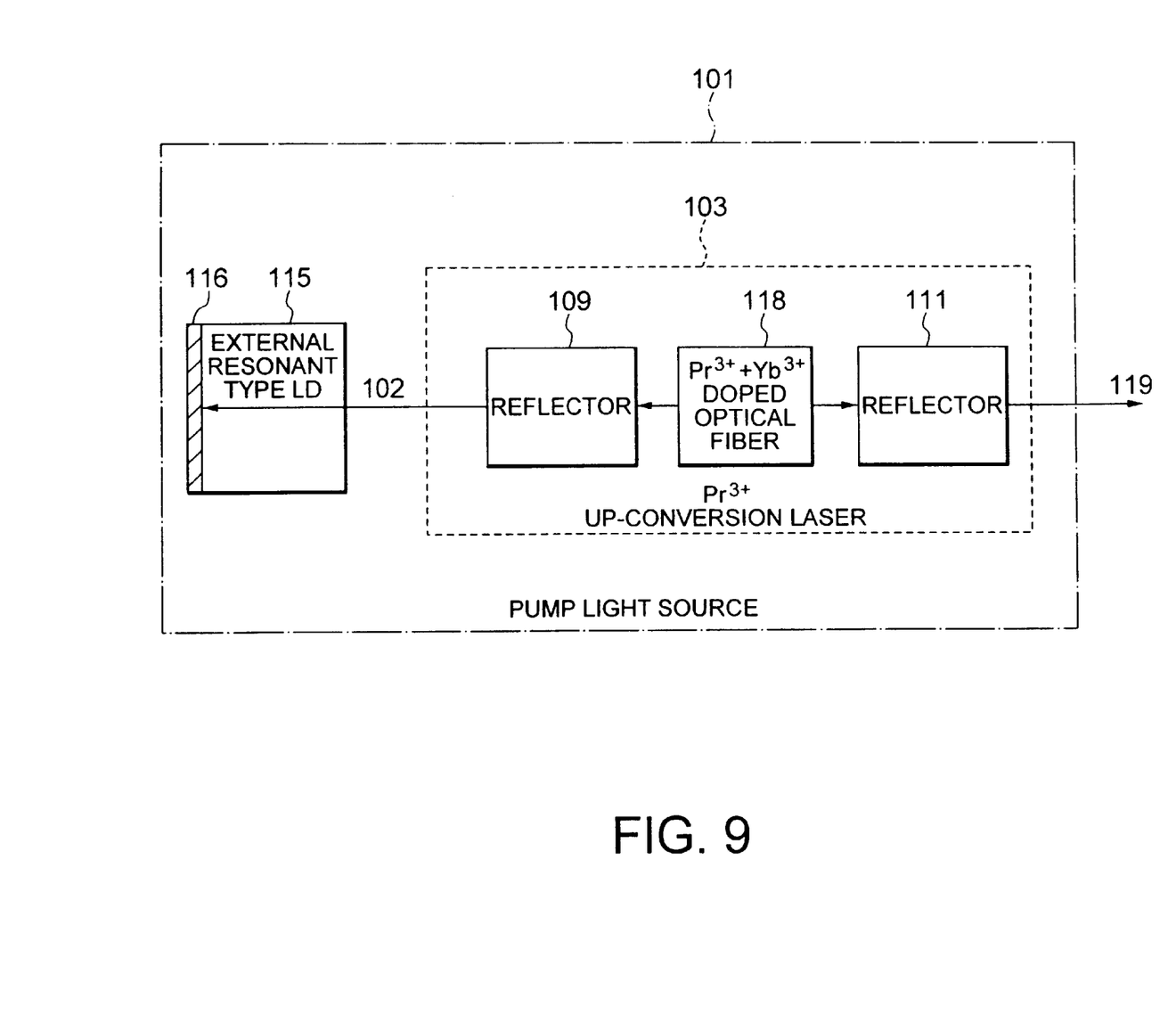
FIG. 9 is a constitutional diagram for explaining a seventh embodiment of the present invention.

FIG. 9 is a configuration diagram for explaining a seventh embodiment of the present invention. The pump light source 101 comprises an external resonance LD 115 and a second reflector 111. An end-surface 116 of the external resonance LD 115 and the second reflector 111 constitute a resonator to let emit the light of wavelength of the laser light 102 due to the stimulated emission of radiation. In the cavity of the resonator, a $Pr^{3+}+Yb^{3+}$ up-conversion laser 103 is disposed. The $Pr^{3+}+Yb^{3+}$ up-conversion laser 103 comprises a first reflector 109, a $Pr^{3+}+Yb^{3+}$ doped optical fiber 118 and a second reflector 111, the incident laser light 102 passing through the first reflector 109 to enter into the $Pr^{3+}+Yb^{3+}$ doped optical fiber 118. The $Pr^{3+}+Yb^{3+}$ doped optical fiber 118 up-converts the laser light 102 from the pump light source 101 to let emit the light in the neighborhood of 635 nm and 685 nm. The first reflector 109 allows the laser light 102 to pass through but reflects approximately 100 percent of the light in the neighborhood of 635 nm.

The second reflector 111 reflects the light of the wavelength of the laser light 102 and the light in the neighborhood of 635 nm. Thus, two reflectors 109 and 111 constitute a resonator, thereby the light in the neighborhood of 635 nm being amplified due to the stimulated emission of radiation to result in laser oscillation. Here, the reflectivity of the second reflector 111 in the neighborhood of 635 nm is made smaller than that of the first reflector 109 to let emit the laser light 119. So as to prevent the stimulated emission of radiation of the other wavelength from occurring, the reflectivity of the wavelength that is not desired to oscillate is made low.

Thereby, red laser light of wavelength of 635 nm can be obtained. In addition to this, in the above explanation, by changing only the reflection wavelength of the reflector the laser light of other wavelength can be obtained. In FIG. 2, $Pr^{3+}$ ion emits not only in the wavelength of red but also in green of the wavelength of 520 nm due to transition between $^3P_0 \rightarrow ^3H_5$. Accordingly, in FIG. 9, when characteristics of the reflectors 109 and 111 are tailored to reflect the light of 520 nm, green laser light of 520 nm can be obtained.

These red and green wavelengths of 635 nm and 520 nm are suitable as wavelengths for display. Accordingly, together with blue light of 450 nm +480 nm, the laser light source of three primary colors (RGB) can be obtained.

Further, the $Pr^{3+}$ up-conversion laser that has been so far explained as 635 nm+685 nm can be constituted to output in two separate wavelengths of 635 nm and 685 nm and to combine these wavelengths in entering into the $Tm^{3+}$ up-conversion laser. Thereby, output can be controlled of each wavelength.

Figure 10:
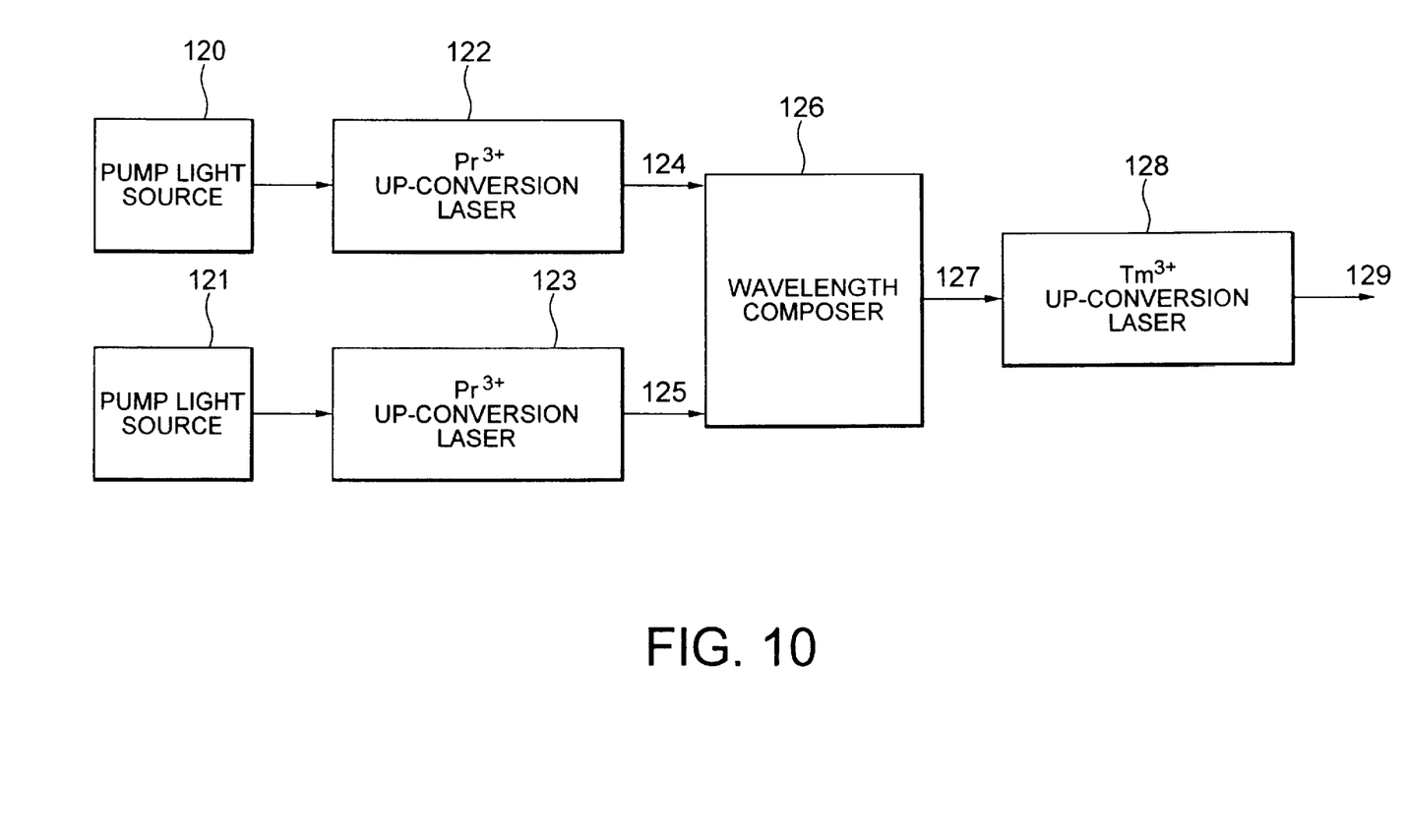
FIG. 10 is a constitutional diagram for explaining an eighth embodiment of the present invention.

FIG. 10 is a configuration diagram for explaining an eighth embodiment of the present invention. That is, the pump light sources 120 and 121 are incident on $Pr^{3+}$ up-conversion lasers 122 and 123 to up-convert, respectively. The respective outputs 124 and 125 of the $Pr^{3+}$ up-conversion lasers 122 and 123 are incident on a wavelength composer 126 to be outputted as the laser light 127. The laser light 127 is incident on the $Tm^{3+}$ up-conversion laser 128 to let output as blue laser light 129.

The $Pr^{3+}$ up-conversion laser 122 is set for the laser light 124 of 635 nm to oscillate, and the $Pr^{3+}$ up-conversion laser 123 is set for the laser light 125 of 685 nm to oscillate. The wavelength composer 126 is set to obtain the laser light 127 of 635 nm and 685 nm. In this configuration, the outputs of the 635 nm and 685 nm can be controlled independently from each other. Further, for the pump light source, substituting for the external resonant type, the $Pr^{3+}$ up-conversion laser 122 can be disposed in the cavity, such as explained in the above configuration.

Thus, by taking advantage of infrared light source of high output power, RGB laser light sources of high efficiency suitable for display can be realized.

While the present invention has been particularly shown and described with reference to preferred embodiments thereof, it will be understood by those skilled in the art that various changes in form and detail may be made therein without departing from the spirit, scope and teaching of the invention. Accordingly, the invention herein disclosed is to be considered merely as illustrative and limited in scope only as specified in the appended claims.

What is claimed is:

1. An up-conversion laser equipment, comprising:
    a first up-conversion laser which pumps praseodymium ions ($Pr^{3+}$), emitting light of wavelengths of approximately 685 nm and approximately 635 nm; and
    a second up-conversion laser which pumps thulium ions ($Tm^{3+}$) with the light of wavelength of approximately 685 nm and further pumps the excited thulium ion with the light of wavelength of approximately 635 nm, output laser light of the second up-conversion laser being wavelengths of approximately 450 nm and/or approximately 480 nm.

2. The up-conversion laser equipment as set forth in claim 1,
    wherein up-conversion excitation of the $Pr^{3+}$ ion is performed by means of two kinds of laser lights of wavelengths of from 780 to 900 nm and of approximately 1010 nm.

3. The up-conversion laser equipment as set forth in claim 2,
    wherein the first up-conversion laser performs up-conversion excitation of praseodymium ion ($Pr^{3+}$) and ytterbium ion ($Yb^{3+}$).

4. The up-conversion laser equipment as set forth in claim 1,
    wherein the first up-conversion laser performs up-conversion excitation of praseodymium ion ($Pr^{3+}$) and ytterbium ion ($Yb^{3+}$).

5. An up-conversion laser equipment, comprising:
    a first cavity including an external resonance laser and a praseodymium ion ($Pr^{3+}$) doped optical fiber wherein with laser light emitted from the external resonance laser as pump light, the praseodymium ion undergoes up-conversion pumping to generate red light of wavelengths of approximately 685 nm and approximately 635 nm; and
    a second cavity including a thulium ion ($Tm^{3+}$) doped optical fiber, wherein the red light pumps the thulium ion to generate blue light.

6. The up-conversion laser equipment as set forth in claim 5,
    wherein the praseodymium ion ($Pr^{3+}$) doped optical fiber is further doped by ytterbium ion ($Yb^{3+}$) in addition to praseodymium ion.

7. The up-conversion laser equipment as set forth in claim 6,
    wherein the external resonance laser emits laser light in the neighborhood of wavelength of 850 nm for excitation of the $Pr^{3+}$ and $Yb^{3+}$ ions.

8. The up-conversion laser equipment as set forth in claim 6,
    wherein two kinds of laser lights of wavelengths of from 780 to 900 nm and from 950 nm to 1050 nm are used for up-conversion excitation of the $Pr^{3+}$ ion.

9. The up-conversion laser equipment as set forth in claim 5,
wherein host glass of the praseodymium ion doped optical fiber is any one of indium based fluoride glass, aluminum based fluoride glass and zirconium based fluoride glass.

10. The up-conversion laser equipment as set forth in claim 5,
wherein as a structure for resonating the red lights or the blue light, a fiber grating or a dielectric mirror is used.

11. An up-conversion equipment, comprising:
a cavity including an external resonance laser emitting two kinds of laser light of wavelengths of from 780 nm to 900 nm and from 950 nm to 1050 nm;
a $P^{3+}$ and $Yb^{3+}$ ion doped optical fiber disposed in the cavity, into which the laser light is inputted; and
a resonator disposed in the cavity to resonate red light generated through up-conversion by the optical fiber.

12. An up-conversion equipment, comprising:
a cavity including an external resonance laser emitting two kinds of laser light of wavelengths of from 780 nm to 900 nm and from 950 nm and 1050 nm;
a $P^{3+}$ and $Yb^{3+}$ ion doped optical fiber, disposed in the cavity, into which the laser light is inputted; and
a resonator disposed in the cavity to resonate green light generated through up-conversion by the optical fiber.

* * * * *